United States Patent [19]

Scott

[11] Patent Number: 4,469,976

[45] Date of Patent: Sep. 4, 1984

[54] SINGLE-SIDE CONNECTED TRANSDUCER

[75] Inventor: William R. Scott, Doylestown, Pa.

[73] Assignee: The United States of America as represented by the Secretary of the Navy, Washington, D.C.

[21] Appl. No.: 395,546

[22] Filed: Jul. 6, 1982

[51] Int. Cl.³ .............................................. H01L 41/08
[52] U.S. Cl. .................................... 310/334; 310/365; 310/366; 310/800
[58] Field of Search ................ 310/800, 363, 364-366, 310/334, 336, 337

[56] References Cited

U.S. PATENT DOCUMENTS

| 2,875,355 | 2/1959 | Petermann | 310/366 X |
| 3,940,637 | 2/1976 | Ohigashi et al. | 310/800 X |
| 3,971,250 | 7/1976 | Taylor | 310/800 X |
| 4,071,785 | 1/1978 | Yoshida et al. | 310/800 X |
| 4,184,095 | 1/1980 | Stacchiotti et al. | 310/366 |
| 4,218,631 | 8/1980 | Yamaguchi | 310/366 X |
| 4,325,060 | 4/1982 | Purtell | 310/366 X |
| 4,339,683 | 7/1982 | Scott et al. | 310/363 X |
| 4,356,421 | 10/1982 | Shimizu et al. | 310/365 |

FOREIGN PATENT DOCUMENTS 58391 5/1977 Japan .................... 310/365

OTHER PUBLICATIONS

PVF₂ Transducers, by Shaw et al, Proceedings of IEEE Ultrasonics Symposium, Boston, Ma., Nov. 5-7, 1980.

Primary Examiner—Mark O. Budd
Attorney, Agent, or Firm—Robert F. Beers; Henry Hansen

[57] ABSTRACT

A transducer is provided having interconnections between a conductive member and one side of a heat sensitive piezoelectric substrate such as $PVF_2$ to or from which electric signals flow. The interconnections are positioned on one side of the substrate with the opposite side having a metalization under the interconnection attachment positions and in a continuous region therebetween. The interconnection includes adhesive material such as epoxy disposed between and attaching an electrically conductive member to one side of the substrate and a single contiguous electrically conductive coating applied to adjacent portions of these two members to electrically connect them. Since both interconnections are positioned on one side of the substrate the transducer is adhesively fastenable to operational structure with a strong bond line, permits lead attachment after mounting and prevents lead shortout. Various electrode shapes, sizes and patterns may be constructed to allow power channeling and to produce focusing of the transducer signal.

1 Claim, 5 Drawing Figures

SINGLE-SIDE CONNECTED TRANSDUCER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to the formation of transducers and more particularly to the formation of transducers utilizing heat-sensitive piezoelectric substrate.

Polyvinylidene fluoride ($PVF_2$) has received considerable interest as a material for piezoelectric transducers in non-destructive testing applications such as acoustic emission and ultrasonic pulse echo testing, particularly from aircraft components under fatigue test. Such transducers are less brittle than ceramic piezoelectric transducers, and have other highly desirable properties. For further information, see Robinson, A. L. Flexible $PVF_2$ Film: *An Exceptional Polymer for Transducers, in Science*, 200 (4348): p. 1371–1374, June 23, 1978. Higher frequency transducers are needed to detect smaller critical flaws, but at frequencies of 20 MHz and above, ceramic piezoelectrics are thin and fragile, a problem not encountered with $PVF_2$. In addition, $PVF_2$ can function at higher power levels than many ceramic piezoelectric elements without suffering dielectric breakdown and subsequent failure. $PVF_2$ films have also been used as diaphragms for loudspeakers and earphones. One method that is utilized to make effective connections to $PVF_2$ is to utilize an epoxy disposed between and attaching a conductor to a $PVF_2$ film and a contiguous electrical conductive coating applied to adjacent portions to electrically connect them as shown in U.S. Pat. No. 4,339,683. However, such technique requires that conductive coatings and wire leads be formed and attached on opposite sides of the film to form an active transducer area therebetween. Positioning the electrical connection on both sides of the substrate obstructs adhesive fastening to operational structures and prevents utilization of such transducers in structures which physically require that they be adhesively fastened with a smooth strong bond line. The production of operational structures utilizing transducers with electrical connections on both sides are costly and time consuming since the connections must be made prior to mounting on the structure. Additionally, when the electrical connections are on both sides and one of such sides is attached to the structure it becomes increasingly difficult to prevent the leads from shorting to the structure.

SUMMARY OF THE INVENTION

Accordingly, it is a general purpose of the present invention to provide structure capable of effecting heat-sensitive piezoelectric substrate transducers which can be adhesively attached to an operational structure with a smooth, strong bond.

Other objects of the present invention are to provide a transducer having strong, durable electrical connections, which have good current carrying capacity, good mechanical strength, do not burn out with normally expected use, need not be applied to previous metalization, do not adversely affect the device to which it is applied, and which are capable of reliable transfer of electrical signals therethrough.

Further objects of the present invention are to provide a transducer having a strong, durable electrical connection with low contact resistance, reducing localized heating at high electrical loads of the material to which the lead is attached, reducing arcing and electrical anomalies of that type to prevent resultant localized damage to the connected members from heating, reducing damage to metalization caused by arcing, providing thermal protection to heat-sensitive substrates to which the connection is applied, and preventing breakdown of the connection.

Still other objects of the present invention are to provide a transducer having soldered connections to a heat-sensitive member or device without damaging that member or device.

Still further objects of the present invention are to provide a piezoelectric transducer which is flexible and lightweight, having lead attachment points or electrical connections which are disposed away from the acoustically active area of the transducer to keep the field of the active area of the transducer away from acoustical or electrical anomalies produced by the lead attachment point(s), reducing anomalies in beam pattern, preventing arcing between plates of the transducer, preventing localized arcing near the surface of the transducer, and preventing breakdown of or damage to the connection or to the transducer material.

Another object of the present invention is to provide a transducer having a heat-sensitive piezoelectric substrate with electrical interconnections positioned to minimize shorting out thereof to operational structure. A further object of the present invention is to provide a transducer having a heat-sensitive piezoelectric substrate having electrical interconnections positioned thereon so that transducer manufacture is simplified for quantity production.

Still another object of the present invention is to provide a transducer having electrodes of various shapes and sizes to vary the power channeled into the respective electrode. A still further object of the present invention is to provide a transducer having electrode patterns for providing focusing of signals radiated therefrom.

Briefly, these and other objects of the present invention are accomplished by an electrical and mechanical interconnection between a conductive member and a heat sensitive piezoelectric substrate such as $PVF_2$ to or from which electrical signals are to be provided by the positioning of such interconnection on one side of the substrate, by metalization under the interconnection attachment positions and in a continuous region therebetween. The metalization on the underside of the substrate is vacuum deposited using a mask over the inappropriate regions. The interconnection includes adhesive material such as epoxy disposed between and attaching an electrically conductive member to one side of the heat sensitive piezoelectric substrate and a single contiguous electrically conductive coating applied to adjacent portions of these two members to electrically connect them. The substrate can first be partially masked to expose only those portions which are to receive the conductive coating. To form the connection, one or more wires or electrodes, are fixed to the substrate with epoxy. Adjacent areas of the wires and of the substrate are then coated with a contiguous conductive coating such as by sputtering gold thereon. The substrate should be masked before coating, and then unmasked after applying the coating, especially where multiple connections are desired, to prevent arcing or undesired interconnection between the coatings of the respective connections. Appropriate masking and positioning of the connections also keeps the field of the active area of the transducer away from electrical and acoustic anomalies produced by the connection(s).

Other objects, advantages and novel features of the invention will become apparent from the following detailed description of the invention when considered in conjunction with the accompanying drawings wherein:

DESCRIPTION OF THE PREFERRED EMBODIMENT

Figure 1:
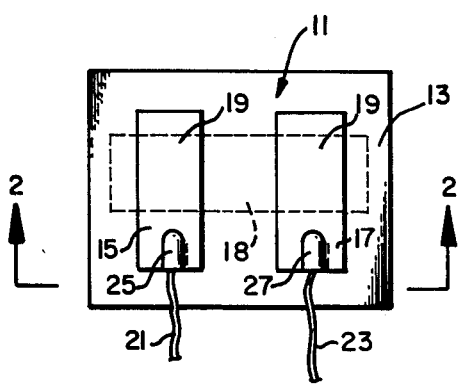
FIG. 1 is a plan view of a preferred embodiment of a piezoelectric transducer according to the present invention.
Figure 2:
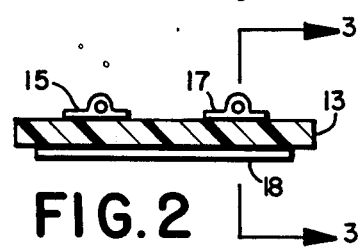
FIG. 2 shows an end elevation view of the transducer of FIG. 1.

Referring now to the drawings, wherein like reference characters designate like or corresponding parts throughout the several views, there is shown in FIGS. 1 and 2 a transducer 11 including a strip of film of polyvinylidene fluoride ($PVF_2$) or other appropriate material 13 provided with conductive coatings 15 and 17 formed on the same side of the film and which are configured to form two thin metallic parallel transducer plates. On the opposite side of the film, a metalized plate 18 is vacuum deposited under coatings 15 and 17 and in a continuous perpendicular region therebetween. A mask is used to prevent metalization from depositing on inappropriate regions. Plates 15 and 17, and metalized plate 18 together define an active transducer area 19 immediately therebetween and bounded by the respective faces of plates 15 and 18 and 17 and 18. Film 13 can for example be one inch long by 0.25 inch wide by 30 or 9 microns thick. Conductive coatings 15 and 17 are respectively connected to wire leads 21 and 23 via respective connections 25 and 27. Coatings 15 and 17 can for example each be of sputtered gold. Electrical signals can be provided to active area 19 via coatings 15 and 17 from respective wires 21 and 23 connected thereto. As can be more clearly seen in FIG. 1, a metallization-free border is provided about the edge of film 13 to prevent arcing between coatings 15, 17 and plate 18 about the edges of transducer 11. Also, active transducers area 19 is displaced from the area of connections 25 and 27 to prevent electrical or acoustic anomalies about the connections from interfering with or appearing in the active area.

Figure 3:
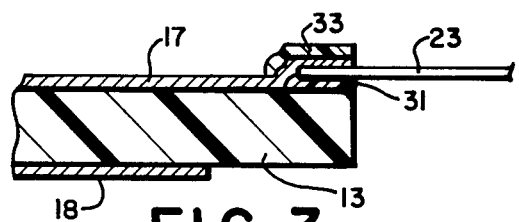
FIG. 3 shows a side elevation view of a transducer according to the present invention.

A representative connection 27 is shown in a sectional view in FIG. 3. Connection 27 includes a respective adhesive layer 31 such as of epoxy bonding respective wire 23 to film 13, and a respective metal or other conductive layer 17 such as of sputtered gold electrically connecting respective wire 23 to film 13. Connection 27 can additionally be provided with an additional protective layer of adhesive 33 such as of epoxy to provide heat dissipation from, and ensure mechanical strength of the connection. Conductive layer 17 also serves as the transducer 11 plate, so that there is direct electrical connection between the respective plate and respective lead wire 23.

Figure 4:
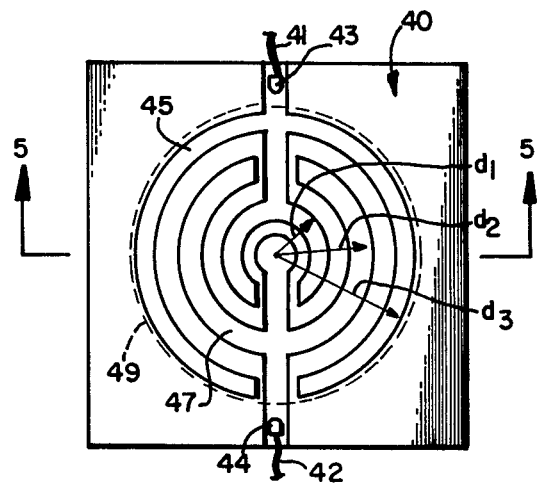
FIG. 4 shows a plan view of another preferred embodiment of a concentric ring focusing transducer according to the invention.
Figure 5:
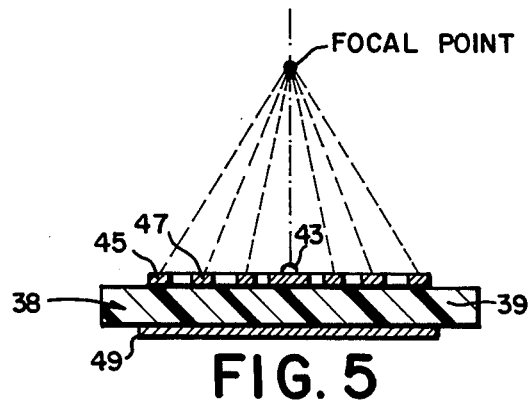
FIG. 5 shows a side elevation of the transducer FIG. 4, showing a focal point resulting therefrom.

There is shown in FIGS. 4 and 5 another preferred embodiment. A transducer 40 including a strip of film ($PVF_2$) 39 is provided with conductive coatings 45 and 47 formed on the same side of the film and which are configured to form thin metallic concentric transducer plates. Conductive coating 45 extends over connection 43 and radially therefrom in opposite direction creating a first circumferential plate or electrode having a diameter $d3$ and extending toward the center thereof and again radially in opposite directions creating a second circumferential electrode having a smaller diameter $d1$. A small segment of the first and second electrode in alignment with connection 43 is uncoated so that conductive coating 47 can extend over connection 44 and radially therefrom in opposite directions creating an interradial circumferential electrode having a diameter $d2$ and a center portion extending within said second electrode. There is no direct mechanical connection of coating 45 to coating 47, the electrodes created by 45 are interspaced by alternate rings of uncoated film 39 and coating 47. The concentric plates form a Fresnel zone pattern thereby providing transducer focusing. Coatings 45 and 47 form upper electrodes that may be constructed in various shapes and sizes to vary power channeled into either electrode. On the opposite sides of the films a metalized plate 49 is vacuum deposited forming a lower electrode under coatings 45 and 47. The combination of upper electrodes and lower electrodes (lower metalization) comprises an active transducer area 39 immediately therebetween and bounded by the respective faces of plates 45 and 49 and 57 and 49. Conductive coatings 45 and 47, are respectively connected to wire leads 41 and 42 via respective connections 43 and 44. Coatings 45 and 47 can for example, each be of sputtered gold. Electrical signals can be provided to the active transducer area via coatings 45 and 47 from respective wires 41 and 42 connected thereto. Active transducer area is displaced from the area of connections 43 and 44 to prevent electrical or acoustic anomalies about the connections from interfering with or appearing in the active area. Connections 43 and 44 are similar to connections 25 and 27.

In summary, operation of the foregoing invention is as follows. Conductive elements such as wires are attached to one side of a substrate of $PVF_2$ film and yet provide a reliable transducer. Except where the substrate is masked, the substrate is coated on one side with conductive material, to provide electrical interconnection between the substrate and the conductive element.

It should be understood that substrates such as $PVF_2$ films can be provided with reliable electrical connections on one side thereof and to form a reliable transducer according to the present invention. Also, any desired number of connections and transducers can be provided to such a substrate if appropriate masking is used. To form transducers 11 or 40, the connections need not be placed on opposite sides of the film 13 or 39 but can, for example, be disposed on the same side of film 13 or 39 in different configurations or patterns on the plane of the film, with the active area of the transducer between the faces of the conductive coating and displaced from the connections to avoid anomalies.

Some of the many advantages of the invention should now be readily apparent. For example, a novel transducer has been provided having strong, reliable mechanical and electrical interconnection between a wire and one side of a heat sensitive piezoelectric substrate. A transducer is thereby provided with lead attachment points on one side of a heat sensitive piezoelectric substrate relatively remote from the active area, preventing high fields (e.g. $0.2 \times 10^6$ volts/cm.) from building up near lead attachment points. Such fields can produce arcing and subsequent burnout near the lead attachment points. Displacing the active area from the electrical connections also maintains the field of the active area away from electrical or acoustic anomalies produced by the lead attachment point. A transducer is provided having a heat-sensitive piezoelectric substrate with electrical interconnections positioned for minimizing lead short out to operational structure, for manufacturing simplification.

Additionally, a transducer is provided having various electrode shapes, sizes and patterns to vary the power channeled therein and effecting transducer focusing.

Obviously, many modifications and variations of the present invention are possible in light of the above teachings. It is therefore to be understood that, within the scope of the appended claims, the invention may be practiced otherwise than as specifically described.

What is claimed is:

1. A transducer device comprising:
   a piezoelectric substrate consisting essentially of polyvinylidene fluoride;
   a pair of discrete plate electrodes disposed on one side only of said substrate and formed to provide a metal-free border about the edge of said substrate;
   a conductive metal plate formed on the other side of said substrate, opposite of and overlapping said plate electrodes, thereby forming an active transducer area between said plate electrodes, said conductive metal plate being formed to provide a metal-free border about the edge of said substrate;
   a pair of electrical wire leads each respectively connected to said plate electrodes and displaced from said active transducer area and constituting the only external electrical connections to the transducer; and
   nonconductive adhesive fixedly interposed between each of said wire leads and said substrate whereby said wire leads are affixed to said substrate.

* * * * *